United States Patent
Roth et al.

(10) Patent No.: US 6,888,731 B2
(45) Date of Patent: May 3, 2005

(54) METHOD AND APPARATUS FOR REPLACING DEFECTIVE ROWS IN A SEMICONDUCTOR MEMORY ARRAY

(75) Inventors: Alan Roth, Austin, TX (US); Douglas Perry, Kinburn (CA); Richard Foss, Kirkaldy Fife (GB)

(73) Assignee: Mosaid Technologies Incorporated, Kanata (CA)

( * ) Notice: Subject to any disclaimer, the term of this patent is extended or adjusted under 35 U.S.C. 154(b) by 0 days.

(21) Appl. No.: 10/306,734

(22) Filed: Nov. 29, 2002

(65) Prior Publication Data

US 2004/0105289 A1 Jun. 3, 2004

(51) Int. Cl.[7] .............................................. G11C 15/02
(52) U.S. Cl. ..................... 365/49; 365/200; 365/230.03
(58) Field of Search ............... 365/49, 230.03, 365/200, 207, 230.06, 189.07, 230.08, 239

(56) References Cited

U.S. PATENT DOCUMENTS

| | | | |
|---|---|---|---|
| 5,327,383 A | * | 7/1994 | Merchant et al. ....... 365/185.24 |
| 6,229,742 B1 | | 5/2001 | Srinivasan et al. |
| 6,249,467 B1 | * | 6/2001 | Pereira et al. .............. 365/200 |
| 6,275,426 B1 | * | 8/2001 | Srinivasan et al. ......... 365/200 |
| 6,445,628 B1 | * | 9/2002 | Pereira et al. .............. 365/200 |
| 6,525,987 B2 | * | 2/2003 | Hilbert .................. 365/230.06 |
| 2002/0122337 A1 | | 9/2002 | Kanazawa et al. |

* cited by examiner

Primary Examiner—Thong Q. Le (57) ABSTRACT

A method for replacing a defective row in a CAM array, the array having a plurality of normal rows of cells and at least one spare row of cells, each the row being enabled by a corresponding word line signal, and having corresponding match line outputs switched to corresponding ones of a plurality of match line inputs in a match line decoder, the method comprising the steps of: (a) generating a signal indicative of the location of a defective row in the array; (b) generating a set of word line select signals for selecting ones of the plurality of normal rows; (d) using the defective row signal to switch a word line select signal of the defective row to a row adjacent the defective row and switching the adjacent row word line select signals to subsequent rows upto the at least one spare row, and (e) using the defective row signal to switch the match line input of the row adjacent the defective row to the matchline input of the defective row and switching the subsequent row match line input to the adjacent row match line input, repeating the switching for subsequent matchlines upto the matchline of the at least one spare row.

12 Claims, 11 Drawing Sheets

METHOD AND APPARATUS FOR REPLACING DEFECTIVE ROWS IN A SEMICONDUCTOR MEMORY ARRAY

This invention relates to a redundancy system for repairing rows in a semiconductor memory array. More particularly, the invention describes a method for selecting a redundancy row and disabling a defective row without affecting the priority order of match lines and wherein the bit map remains topologically unaltered except for a skipped line or lines in the array(s).

BACKGROUND OF THE INVENTION

Many techniques have been developed for repairing defective rows or columns in memory devices by using redundant rows or columns to replace faulty bit cells or lines. Using redundancy to improve semiconductor yields is well known in the art. The address(es) of the defective elements are stored in a non-volatile way, generally by way of fuses. When such an address is fed into the chip, it selects a redundant element and the original defective element is ignored or explicitly disabled. The location of the spare element is governed solely by layout convenience.

Prior art proposals for applying row redundancy for memories include disabling a defective row and replacing it with a spare row located at the outer boundaries of the memory array. Other redundancy schemes, as described in U.S. Pat. No. 6,249,467 teach replacement of a defective row with a spare row that can be in the same memory block or in a different block. This redundancy scheme poses a problem for the normal operation of Content Addressable Memory (CAM) cell arrays.

A CAM is distinguished from other memory devices in that the memory cells are connected to match lines. Rows of Match lines are fed into a priority encoder which provides either one or a plurality of addresses sorted by a priority. Priority is normally given to the row with the lowest physical addresses. Thus, the relative location of rows of memory cells and their associated match lines is important. Accordingly, a remapped row of cells requires a corresponding remap of the priority encoder. The complexity of the logic to implement such a mapping will be evident to those skilled in the art.

SUMMARY OF THE INVENTION

In a fist aspect of the invention a method for replacing a defective row in a CAM content addressable memory array is provided. The array has a plurality of normal rows of cells and at least one spare row of cells, each row being enabled by a corresponding word line signal, and having corresponding match line outputs switched to corresponding ones of a plurality of match line inputs in a match line decoder. A signal indicative of the location of a defective row in said array is generated along with a set of word line select signals for selecting ones of said plurality of normal rows. The defective row signal is used to switch a word line select signal of the defective row to a row adjacent to the defective row and to switch the adjacent row word line select signals to subsequent rows up to the at least one spare row. The defective row signal is also used to switch the match line output of the row adjacent to the defective row to the match line input corresponding to the defective row and switching the subsequent row match line output to the adjacent row corresponding match line input, repeating the switching for subsequent match lines up to the match line of the at least one spare row.

In another aspect of the invention a content addressable memory array has a plurality of memory cells arranged in rows, the rows including a plurality of normal rows and at least one spare row. Each row has a match line coupled to the memory cells in the row, the match line for providing a match line output signal indicative of a comparison result. A row select decoder is provided for generating a plurality word line select signals, each word line select signal selectively coupled to one of two adjacent rows. A match line decoder is also provided for selecting a plurality of match line signals to output, each signal to output Is selected from one of two adjacent rows.

In yet another aspect of the invention a method for replacing a defective row in a content addressable memory array is provided. The memory array has a plurality of memory cells arranged in rows) rows including a plurality of normal rows and at least one spare row, each row being enabled by a word line select signal and providing a match line output signal. The location of a defective row in said array is identified and the defective row is disabled by switching the word line select signal to an adjacent row and sequentially switching the word line select signals for the adjacent row and subsequent rows until said least one spare row is reached. The match line output signal from the defective row is deselected and the match line output signal from the adjacent row selected. Subsequent match line output signals are sequentially selected until said at least one spare row is reached.

BRIEF DESCRIPTION OF THE DRAWINGS

These and other features of the preferred embodiments of the invention will become more apparent in the following detailed description in which reference is made to the appended drawings wherein.

DETAILED DESCRIPTION OF THE FIGURES

In the figure like numerals refer to like structures in the drawings.

The present invention describes a simpler and more efficient scheme than hereto achievable for replacing the rows of a CAM in a manner that is transparent to the priority encoder. Ideally, a redundant row should be inserted in the physical slot of the defective row, but this is almost impossible. Conventionally, this is achieved by disabling the defective row and replacing it with a redundant row but still preserving the physical location of the defective row.

In the present invention, the defective row is replaced with an adjacent row, which can be to either side of the defective row, so that the next row, either down (or up) in the array, can serve as the spare row. This is in turn applied to the next row and so on to the last normal row in the array. Finally the spare or redundant row is used as the last row or address.

In order to simplify the requirements to program the location of the defective row, the same signal that diverts the row select from its original row to its adjacent replacement is carried across the array to also divert the match line. Thus the priority encoder circuitry and the priority match order are unaffected by the replacement of a bad row.

Figure 1:
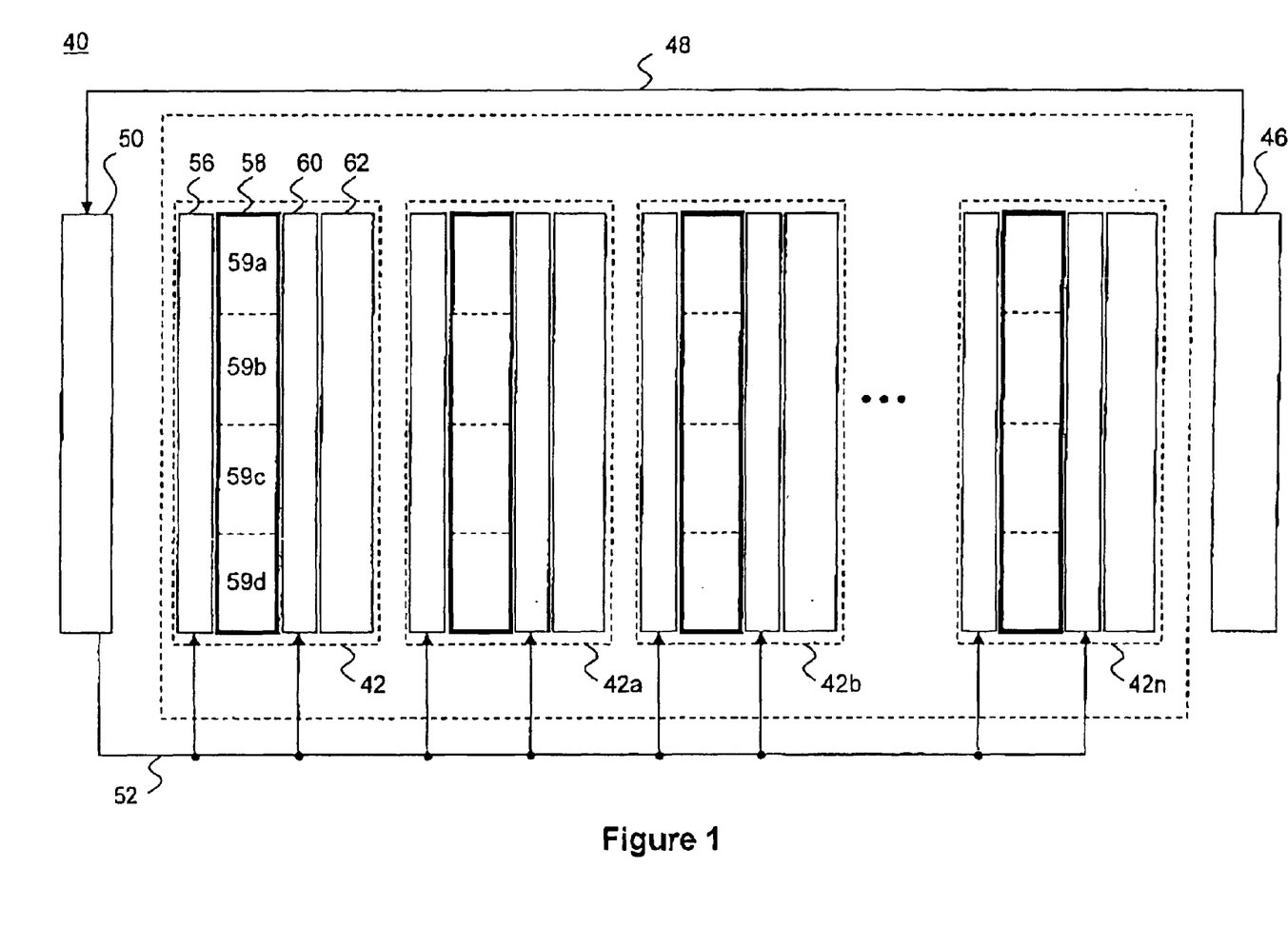
FIG. 1 shows a schematic diagram of the architecture of a Content Addressable Memory (CAM)

FIG. 1 shows schematically a CAM block according to our embodiment of the present invention. CAM block 40 comprises a plurality of identical memory blocks 42, 42a and 42b–42n. For illustrative purposes the memory block 42 is shown as the left most memory block, and memory block 42n is shown as the right most memory block. Each memory block 42 is comprised of a row address decoder 56, memory bank 58, match line decoder 60 and priority encoder 62. Each memory bank 58 is subdivided into a plurality of sections, here exemplified as four sections 59a, 59b, 59c and 59d respectively, with each of the sections comprising a plurality of normal rows of memory cells and at least one row of redundant or spare memory cells. The CAM block 40 also includes a fuse bank 46 for generating address enable signals 48 which are applied to a row select decoder 50 which in turn generates signals 52 to the row address decoder 56 and match line decoder 60.

Although a fuse programmable bank 46 is exemplified, any means to program an address can be implemented. The fuse programmable bank operates in a manner known in the art to provide the location of a defective address.

Figure 2:
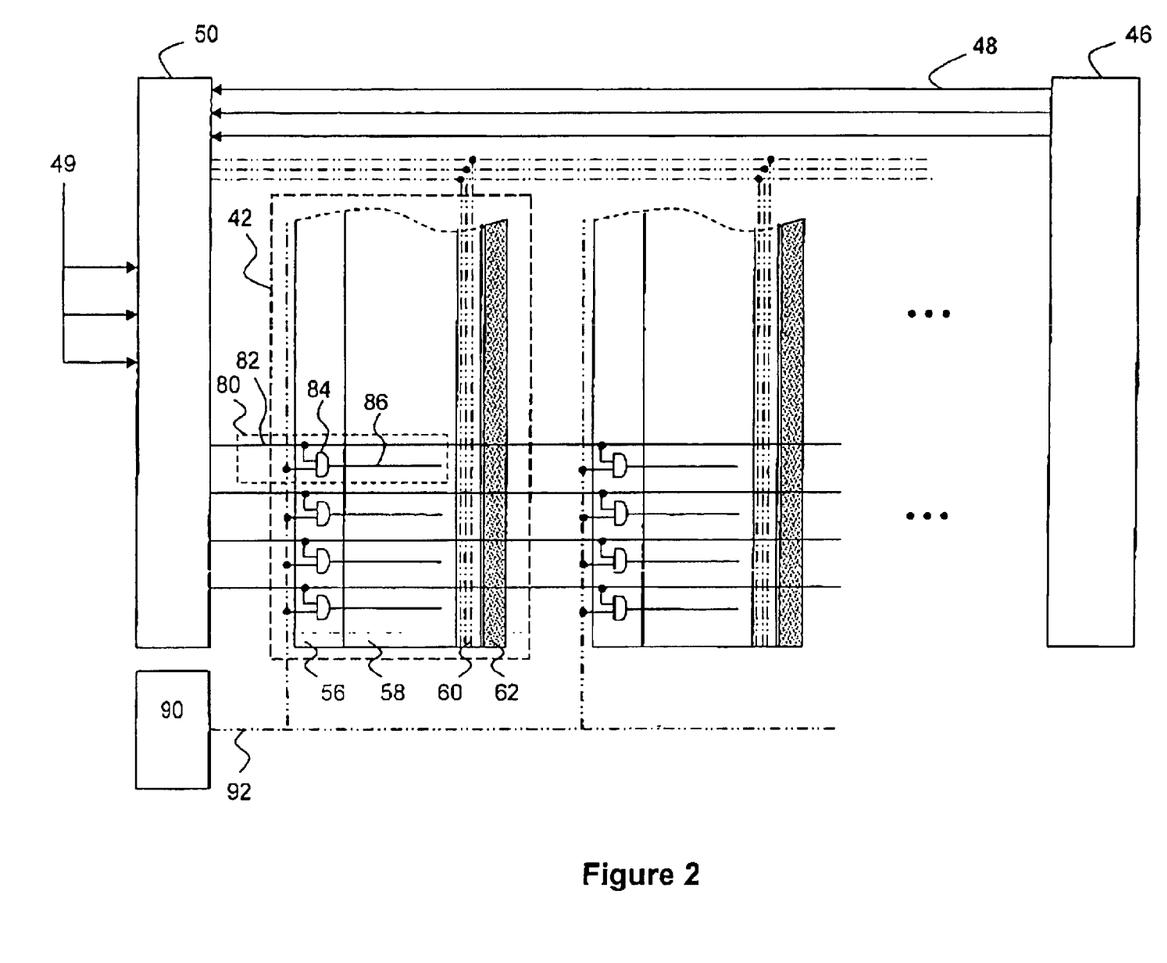
FIG. 2 shows a schematic layout of a CAM block.

Referring to FIG. 2 there is shown in more detail a circuit for activation of a local row in particular memory block. The row select decoder 50 combines the fuse encoded signals 48 with normal row address signals 49 to enable or disable a particular global word line 82 (GWL). The global word line 82 crosses every memory block 42 along a line of all local rows. But in order to activate a particular local row 80 in a particular memory block 42, a local word line 86 has to be selected. Accordingly, The row address decoder 56 in each memory block 42 combines the signal on the global word line 82 signal with a local block select signal 92 generated by a block select decoder 90 in order to select the local word line 86 of the selected memory block.

Figure 3A:
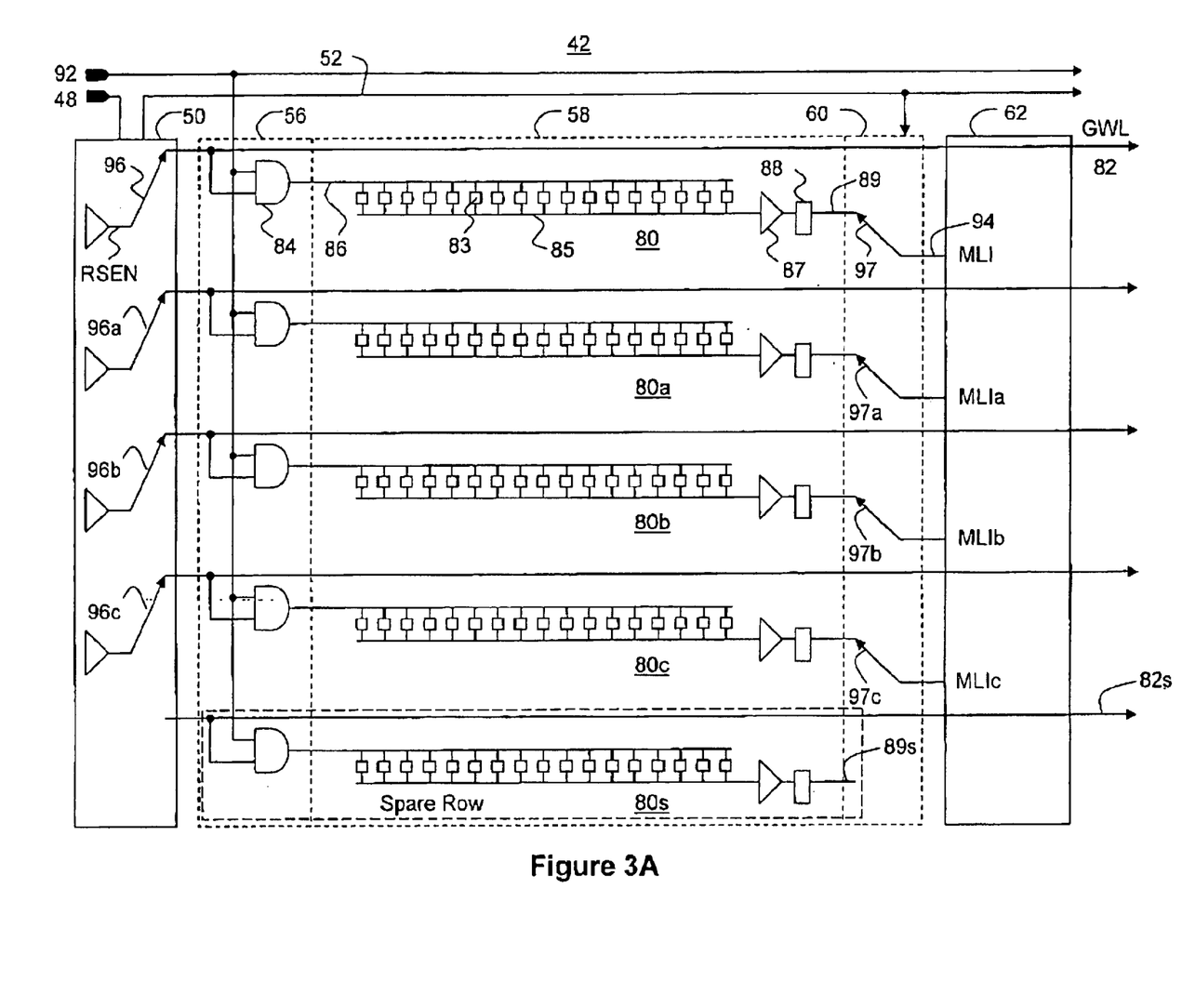
FIGS. 3A and B are schematic diagrams showing the operation of a redundancy system according to the invention.

FIG. 3A shows schematically the arrangement of a memory block 42 with the row select decoder 50 when no defective rows are found in the memory bank 58. As shown in the previous figures, memory block 42 comprises a local row address decoder 56, the memory bank 58, a match line decoder 60 and a priority encoder 62. The local row address decoder 56 comprises a plurality of AND gates 84 for combining the signal on the global word line 82 and the block select signal 92, to generate a signal 86 for activating a corresponding row 80. The output of the AND gates is coupled to respective local word line 86, to which is coupled a plurality of memory cells 83.

Match lines 85 couple the outputs of the cells to a sense amplifier 87 for amplifying the result of the search operation to determine if the information stored in the memory cells 83 matches ("hit") or not ("miss") the searched information. The search operation is performed as it is known in the art. The output of the sense amplifier 87 is latched by latching means 88 for providing a 1-bit match latch output 89 which is provided to the priority encoder in one of its match line inputs MLI 94.

Here shown are four normal rows 80, 80a, 80b and 80c and redundant or spare row 80s and their associated sense amplifies and output latches. The row select decoder 50 generates a row select enabling signal RSEN that is switched, as indicated by arrows 96, to activate an appropriate global word line 82. In the normal operation of the CAM, when no defect is found in the memory bank 58, a default state indicates that no address is specified in the programmable fuse block via line 48, so all the row select enable signals RSEN 96, 96a, 96b and 96c are switched to corresponding ones of the normal rows (shifted up), and all the match lines latch outputs 89 are switched (shifted down) to corresponding ones of match line inputs MLI in the match line decoder 60 as shown by arrows 97, 97a, 97b and 97c. As can be seen, the spare row 80s remains unused and therefore the global word line 82s is not selected by any row select enable signal RSEN 96, and the latch output 89s is not logically connected to any input of the priority encoder 62.

Figure 3B:
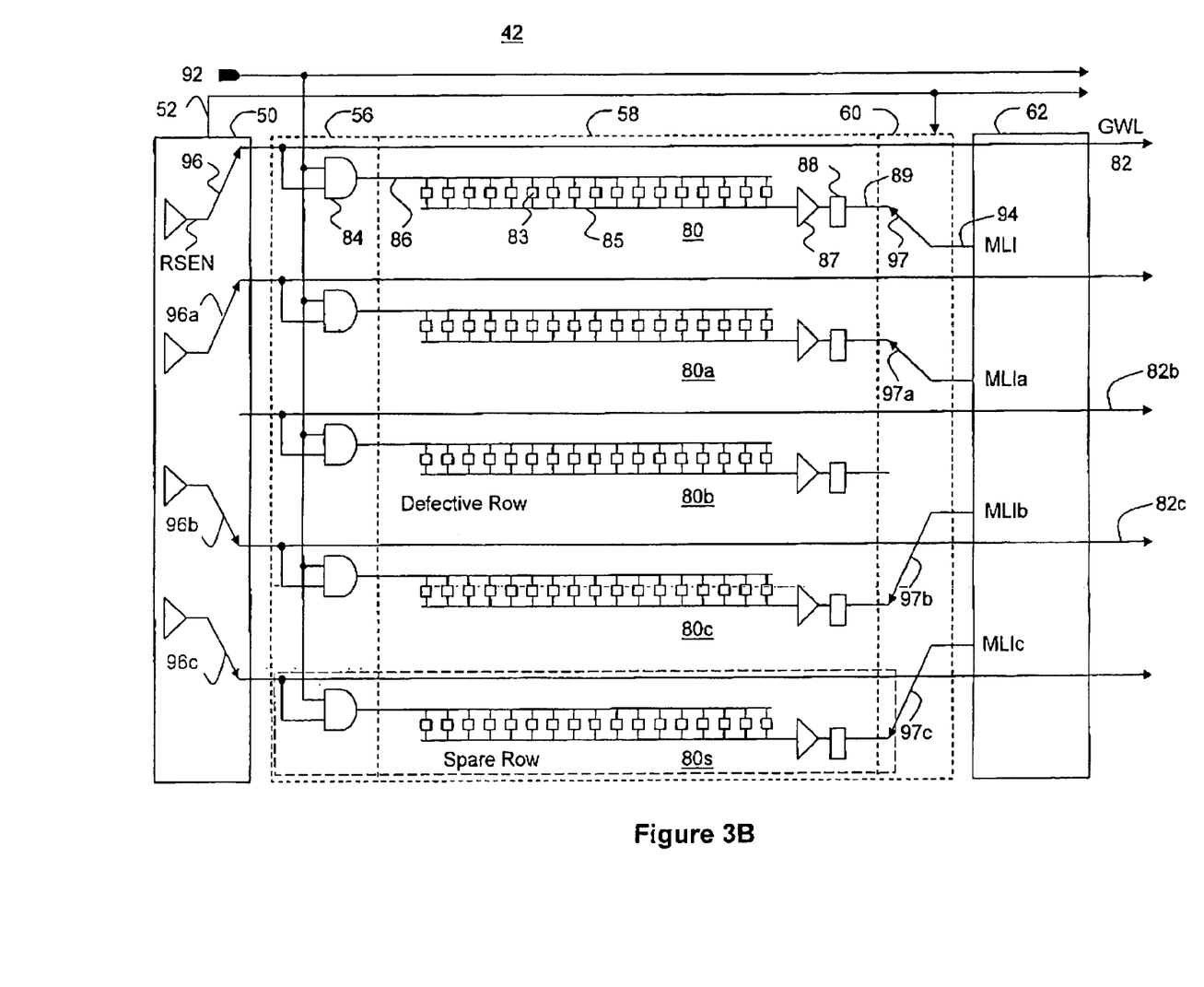

When a defective row is found in any particular line of rows, that row has to be disabled in order to avoid losing data or retrieving wrong data. FIG. 3B shows schematically the arrangement of the memory block 42 with the row select decoder 50 when a defective row is found in the memory bank 58. Assume that row 80b contains a defect. The address of the defective row is programmed, by blowing an appropriate sequence of fuses in the programmable fuse bank 46. Once the address of the defective row address is programmed, encoded redundant address information 48 is sent to the row select decoder 50. Row select decoder 50 decodes the information 48 and activates logic for disabling the defective address by deselecting the corresponding global word line (GWL) 82d and providing a signal 52 to the match line decoder 60 to decouple the input from the defective address and couple it to the replacement address.

As described earlier row select decoder 50 receives the redundancy signal 48 which comprises the address of the defective row. Row select decoder 50 comprises further decoding circuitry in order to deselect the faulty word line 82b in row 80b and redirect it to a neighbouring non-faulty word line 82c of an adjacent row 80c as shown by arrow 96b. A circuit for achieving this shifting or switching is described in more detail in FIG. 9. As it is shown by arrow 97b, the match line decoder 60 redirects the match line from the replacement row 80c to the matchline input previously used by defective row 80b. Thus the replacement of the faulty row is accomplished transparently tb the priority encoder 62. The shifting is applied to subsequent rows, as shown by arrows 96c and 97c, until the last normal address is replaced with the redundant row 80s. Note that the match line inputs 94 (MLI, MLIa, MLIb, and MLIc) of the priority encoder 62 are not affected when the redundancy system is implemented, since the encoder 62 receives the information in its match line inputs 94 in the same order as when no defective rows were present.

Figure 4:
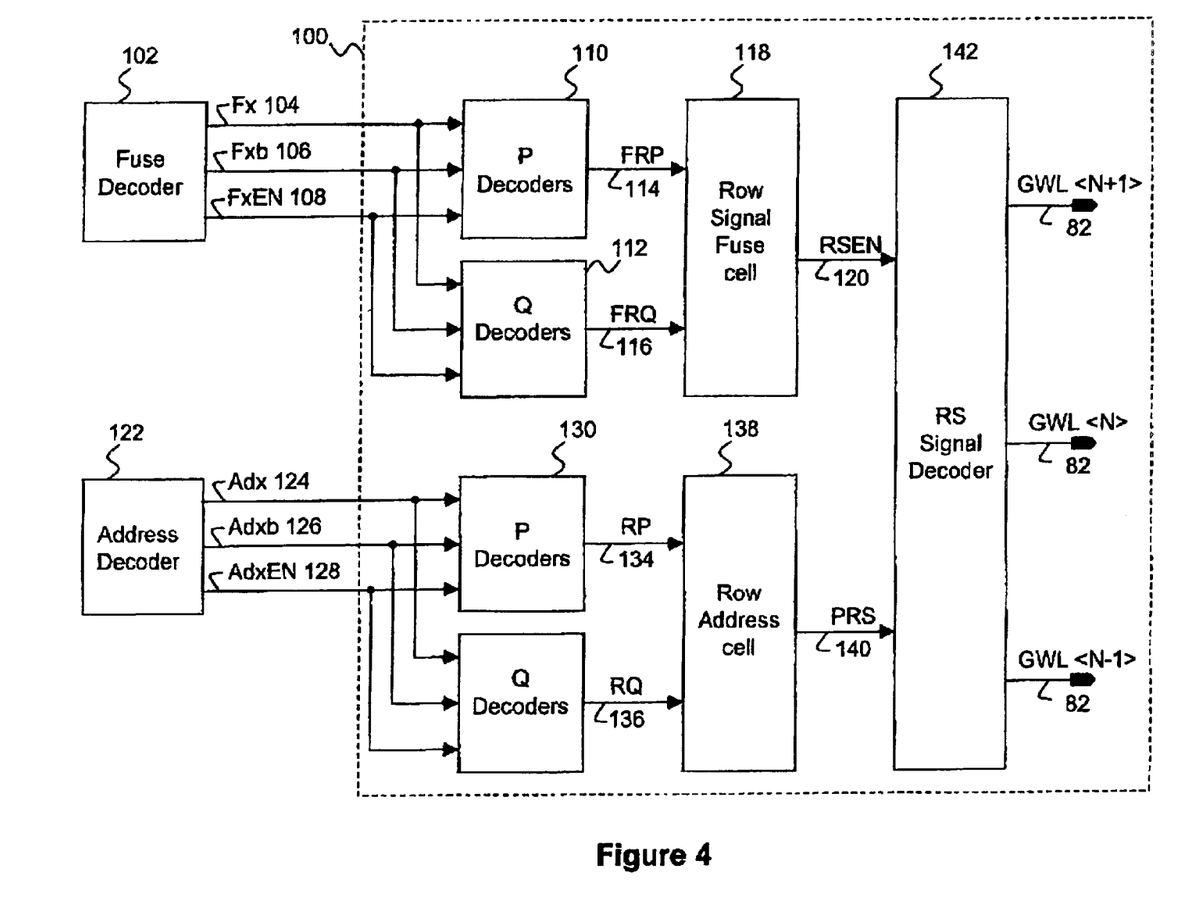
FIG. 4 is a schematic diagram of a redundancy system according to the invention.

Referring to FIG. 4, there is shown a detailed block diagram of tie row select decoder 50. As described earlier, the row select decoder 50 receives redundancy address signals from a programable fuse bank 46 and normal address signals from 49 from an address decoder 122 to generate the appropriate signals to the GWL. For illustration purposes it is assumed that there are 128 rows per section 59 of a memory bank 58. Accordingly, the fuse bank 46 is comprised of a plurality of binary encoded fuse bit encoders, an example of which is described in more detail in FIG. 5, for programming a 7-bit address (corresponding to 128

Figure 6:
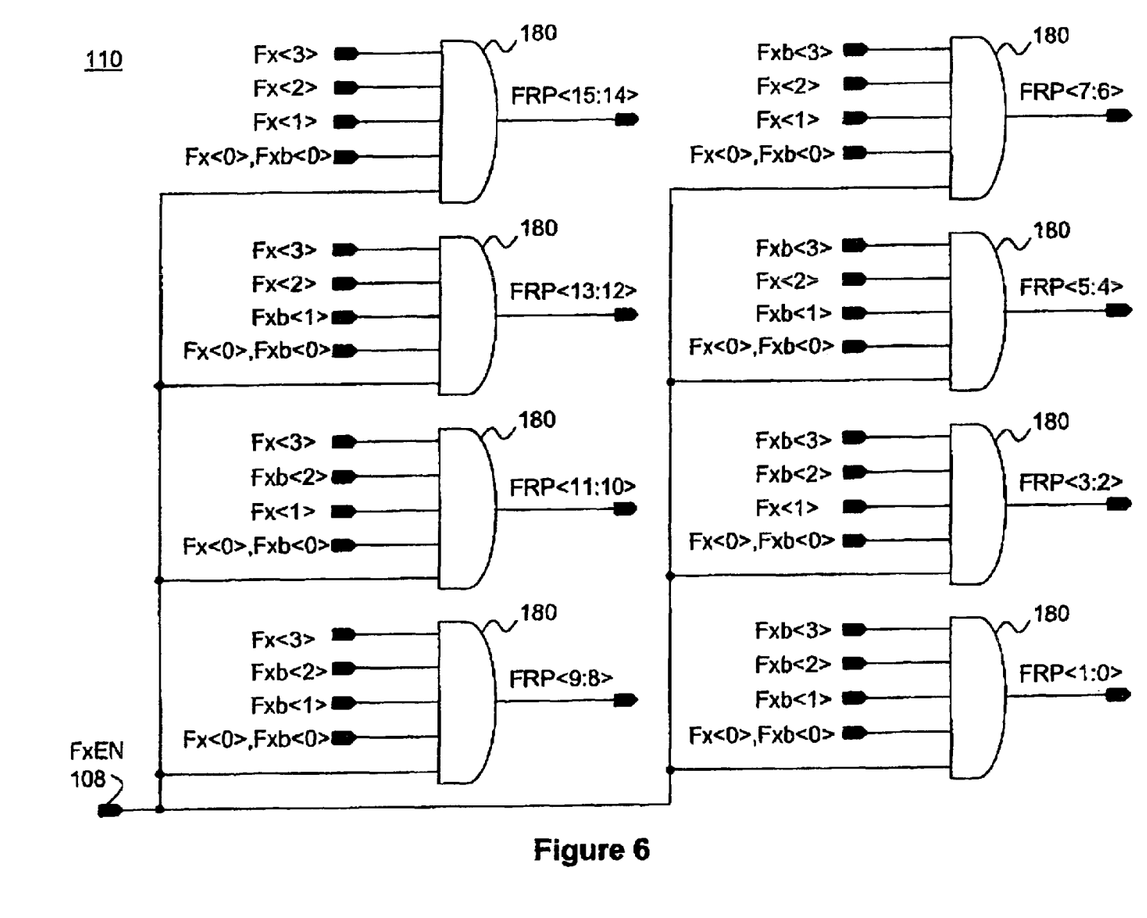
FIGS. 6 and 7 are schematic diagrams of an address decoder.
Figure 7:
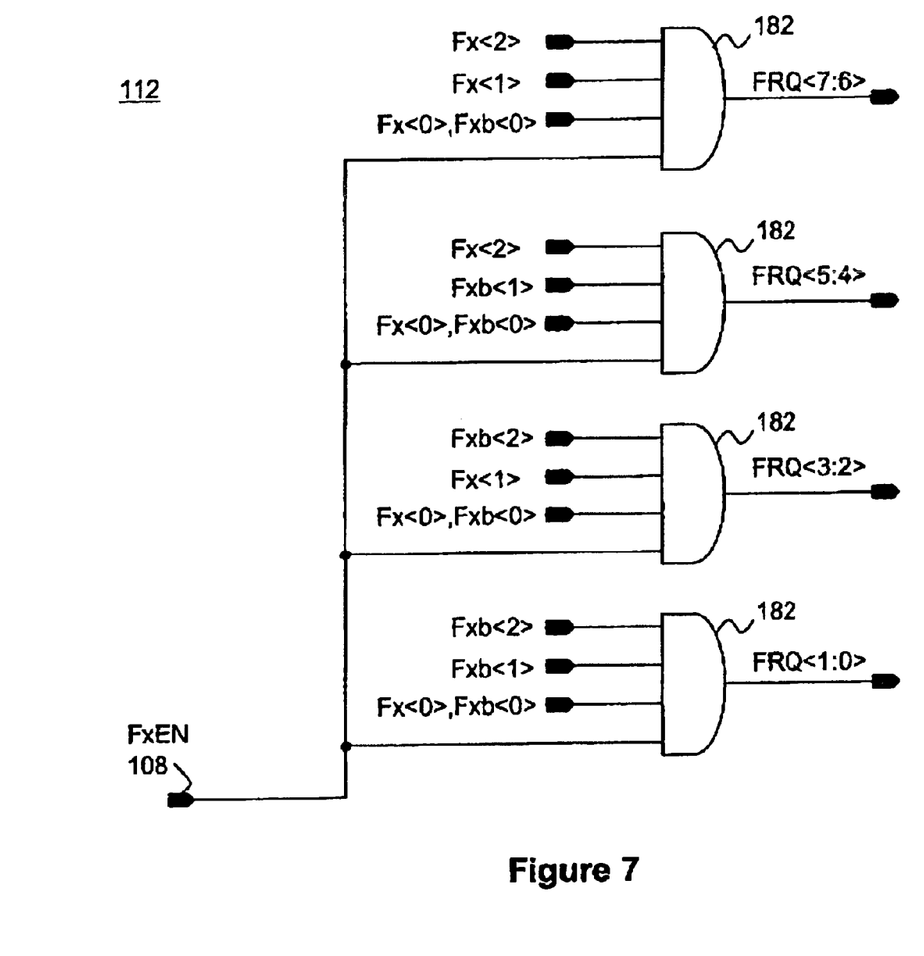
Figure 8:
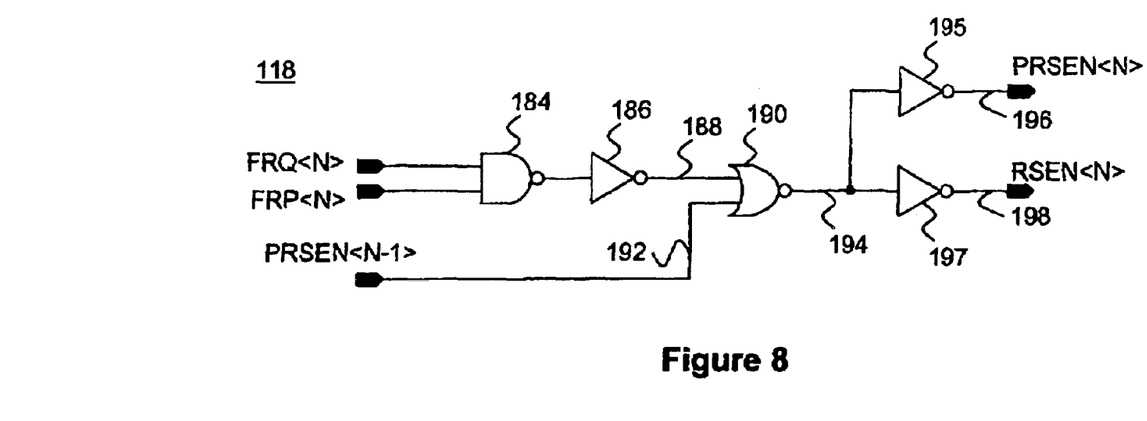
FIG. 8 is a schematic diagram of a row selection signal cell.

GWL's). In the embodiment illustrated, the fuse bank generates signals on seven sets of complementary fuse signal lines Fx (0:6)104, Fxb (0:6) 106 and additionally a fuse enable signal line FxFN 108. The signal lines 104, 106 and 108 are provided as inputs to P decoders 110 and Q decoders 112. The P and Q decoders combine the fuse signal lines, in a manner as illustrated in FIGS. 6 and 7, to generate FRP signals on sixteen signal lines 114 from the P decoders 110, and FRQ signals on eight signal lines 116 from the Q decoders 112. These twenty-four (24) signal lines are combined by a row signal fuse cell block 118, in a manner as illustrated in FIG. 8, to generate the 128 row spare enable signals RSEN 120 which is in turn provided to a row select signal decoder 142.

Figure 9:
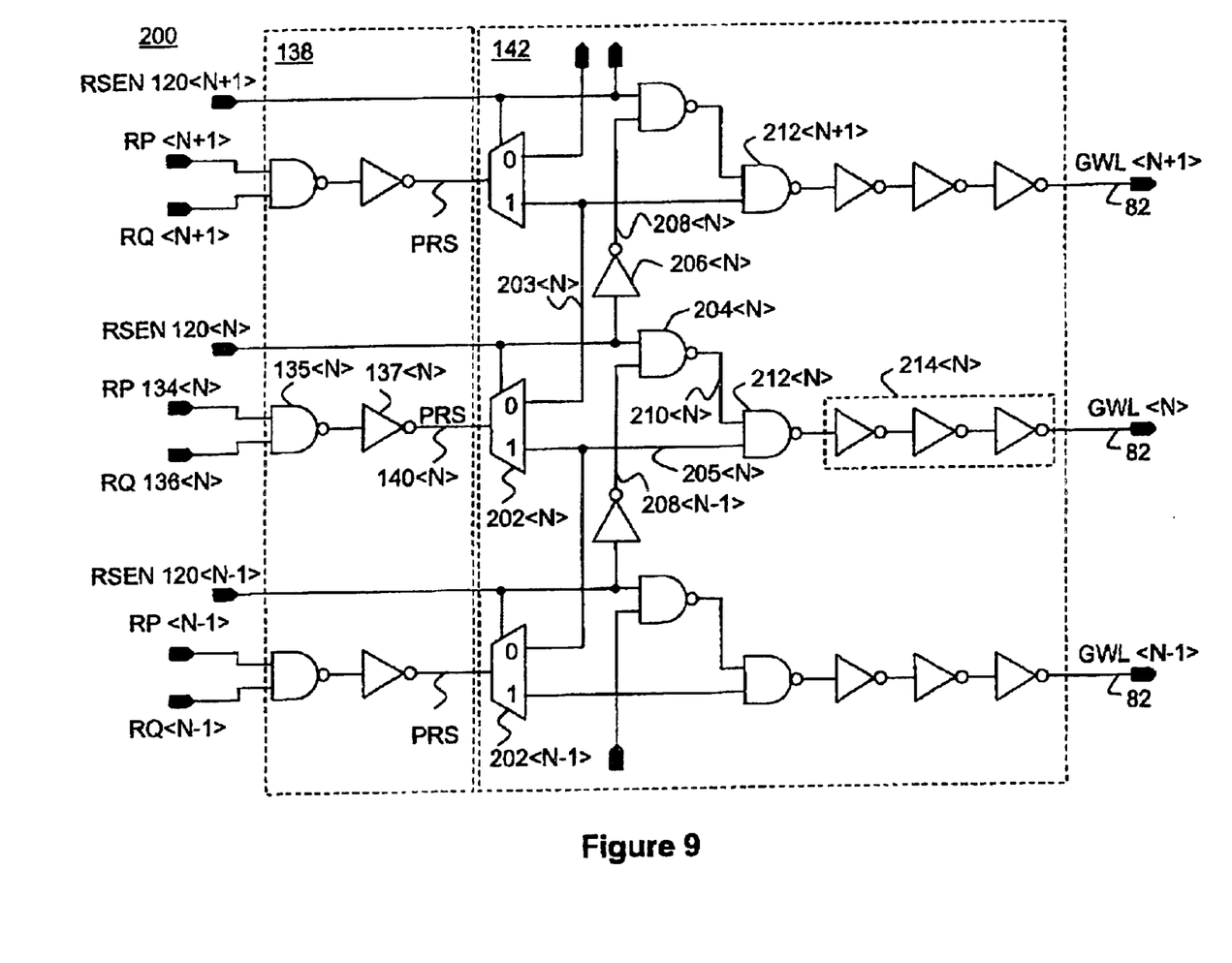
FIG. 9 shows schematically a word line selection decoder.

A Similarly the normal address signals Adx 124, Adxb 126 and AdxEN 128 generated at the address decoder 122. Signals 124, 126 and 128 are provided to both P and Q decoders 130 and 132 to provide 16 RP signals 134 and 8 RQ signals 136 respectively. Signals 134 and 136 are are combined by the the row address cell block 138 in order to generate the 128 normal row enable signals PRS 140. The row select signal decoder 142 utilizes the row spare enable signals RSEN 120 to switch and the normal row enable signals PRS 140 to activate appropriate global word lines GWL 82, as illustrated in FIG. 9.

Figure 5:
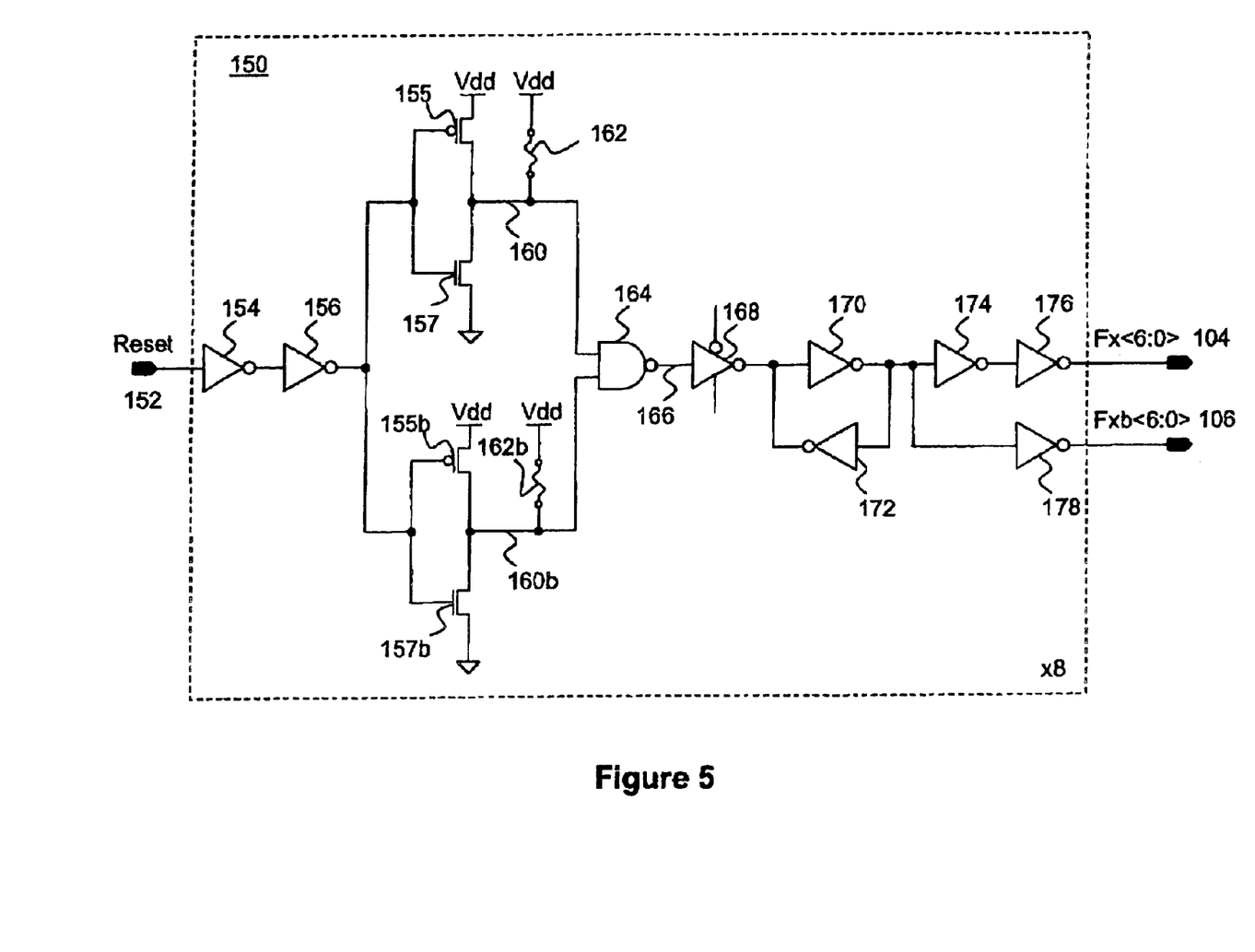
FIG. 5 is a schematic diagram of a fuse programmable address generator.

Referring now to FIG. 5, there is shown a circuit diagram of the binary encoded fuse bit encoder 150 for generating the complementary fuse signals Fx 104, Fxb 106. A reset signal 152 is input to two serially connected inverters 154 and 156 to provide signal 158 to the gates of transistors 155 and 157. Transistor 155 has its source connected to voltage supply Vdd and its drain to node 160. Transistor 157 has its source connected to ground potential Vss and its drain to a fine node 160. Connected between node 160 the Vdd voltage supply is a fuse 164. Similarly this structure is repeated to generate signal 162b, and referenced with numerals having a label "b". Both nodes 160 and 160b are provided to the inputs of a NAND gate 164, to generate an output signal 166. The ouput signal 166 from the NAND gate 164 is provided to a tri-state invert 168, then passes through a series of inverters 170, 172, 174, 176 and 178 to generate complementary signals Fx 104 and Fxb 106. Thus to generate the seven signals as described in FIG. 4, would require seven such circuits The FxEN signal 108 is generated in a similar circuit 150. Even though a conventional single fuse circuit can be used, The two fuse circuit 150 permits that either one of the uses, or both, can be blown to program a bit. Preferably, both fuses 162 and 162b are to be blown. Modem manufacturing processes use copper as the fuse material. Copper fuses are not as reliable as polysilicon, so their reliability is enhanced by using a two fuse circuit. A further embodiment may employ both fuses connected in series, which would mitigate the necessity of having NAND gate 164.

Referring now to FIG. 6 there is shown a schematic diagram of the the P decoders 110, which comprise eight five input AND gates. The signals Fx 104, Fxb106 and FxEN 108 generated in the fuse decoder 150, provide 5 bits to each of the sixteen 5-input AND gates 180. The sixteen bits generated by the AND gates 180 comprise the signal FRP (0:15) 114 previously shown in FIG. 4.

In a similar manner FIG. 7 shows a scheamtic diagram of the circuitry of the Q decoders 112, which comprises eight 4-input AND gates 182 for generating the eight FRQ signals (0:7)116.

On FIG. 8, numeral 119 represents schematically the circuitry comprised in the row signal fuse cell 118 shown in FIG. 4. Circuitry 119 is repeated in a similar number of addresses covered by the redundancy system in order to form the cell 118, i.e. if the redundancy covers one segment of 128 normal addresses and one redundant address, circuitry 119 will be repeated 129 times. The circuit 119 receives signals FRP 114 and FRQ 116 and combine them in the NAND gate 184 for generating output signal 185. Signal 185 is inverted by inverter 186 the inverted signal 188 is provided to one of the inputs of NOR gate 190. NOR gate 190 receives in its second input signal PRSEN 192 from another cell directed for an adjacent row. NOR gate 190 generates output signal 194 which is provided to inverters 195 and 196 to provide inverted signals PRSEN 196 and row spare enable signal RSEN 198. As can be noticed, inverted signal PRSEN 196 is provided as signal 192 for the following row cell 118 in order to propagate the result to the next circuit 119 forming a thermometer code, as will be further described in FIG. 10.

Referring to FIG. 9 there is shown a schematic diagram of the circuitry 142 for switching the different global word lines. More specifically, numeral 200 represents the row address decoder cell 138, and the Row Select Signal Decoder 142. The row address decoder cell 138 receives signals RP<N> 134 and RQ<N> 136 in the inputs of the NAND gate 135<N>. The output of NAND gate 135<N> is inverted by inverter 137<N> to generate the normal row enable signal PRS<N> 140, which is provided to the input of de-multiplexer 202<N>. The de-multiplexer 202<N> comprises two outputs, 203<N> and 205<N> which can be selected by row spare enable signal RSEN 120<N>. Row spare enable signal RSEN 120 is also provided to the inputs of inverter 206<N> and to one input of NAND) gate 204<N>. Inverter 206<N> provides the inverted signal 208<N> to the neighboring upper row N+1 as is shows in the figure. NAND gate 204<N> receives in its second input the inverted signal 208<N-1> which was generated in the neighboring lower row N-1. The output of the NAND gate 204<N> is provided to the first input of the NAND gate 212<N>. The second output of the multiplexer 202<N> is connected to the first output of the multiplexer 202<N-1> and to the second input of NAND gate 212<N>. The output of NAND gate 212<N> is provided to the three serially connected inverters 214<N> and the resulting output is the global word line 82<N> which activates that particular row.

When an specific row is selected, i.e. row N, and no redundancy is required, the RSEN signals are set to 0, thus shifting the addresses to the upper row, for this particular case to N+1 as shown on FIG. 3A. When there is a faulty row and it is necessary to use the spare row, the defective address is programmed in such a way that the defective row and the lower rows receive the RSEN signals set to 1 so they addresses are shifted to the lower rows, i.e. towards row N-1. The connectivity of the signals 203 and 205 of the de-multiplexers 202 are such that a "Thermometer" code can be easily programmed in the programmable bank 46 and implemented in the row select signal decoder 142.

Figure 10:
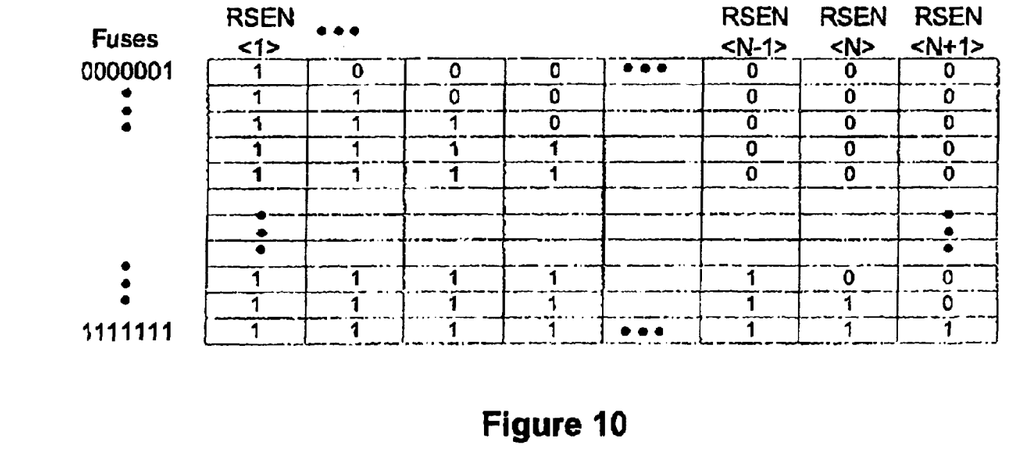
FIG. 10 shows a thermometer code.

FIG. 10 shows an example of a "thermometer" code table used in the present invention, where the rows represent a particular combination of binary values for a given particular address programmed in the programmable bank 46. The columns of the table shows the values of the RSEN signals for a particular programmed address.

Figure 11:
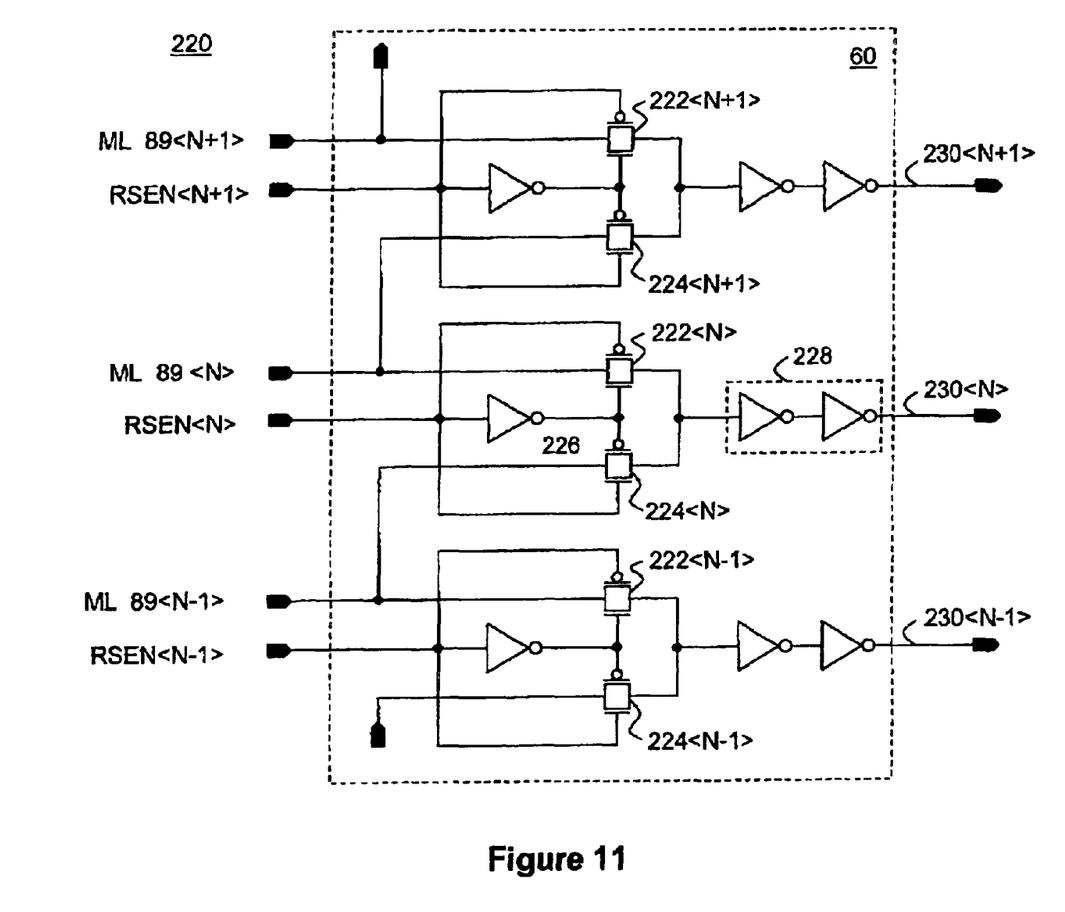
FIG. 11 shows schematically a match line selection decoder.

Referring to FIG. 11, there is shown a schematic diagram of the match line decoder 60 according to the present invention. Row select enable signal RSEN<N> 120 is provided to the gates of a two C-MOS pass gates 222 and 224, as well to inverter 226 in a manner known in the art. The match line latch output signal 89<N> is provided to the first pass gate 222<N> and to the input of the second pass gate 224<N+1> of the neighboring row. in the same manner, the match line latch output signal 89<N−1> is provided to the first pass gate 222<N−1> and to the second pass gate 224<N> respectively. In this way, The match line latch output signal 89<N> can be passed straight through the first pass gate 222<N> or shifted by changing the logic value of the row select enable signals RSEN, To pass through the second pass gate 224<N+1>. By doing so, match line decoder 60 is used to provide full transparency of the redundancy system to the priority encoder 62.

Although the invention has been described with reference to certain specific embodiments, various modifications thereof will be apparent to those skilled in the art without departing from the spirit and scope of the invention as outlined in the claims appended hereto.

The embodiments of the invention in which an exclusive property or privilege is claimed are defined as follows:

1. A method for replacing a defective row in a content addressable memory (CAM) array having a plurality of memory block arrays, said arrays having a plurality of normal rows of cells and at least one spare row of cells, each said row being enabled by a corresponding wordline signal, and having corresponding match line outputs switchable to corresponding ones of a plurality of match line inputs in a match line decoder, said method comprising the steps of:

(a) generating a signal indicative of the location of a defective row in at least one of said arrays;
   (b) generating a set of word line select signals for selecting ones of said plurality of normal rows;
   (c) using said defective row signal to switch a word line select signal of said defective row to a row adjacent said defective row and switching said adjacent row word line select signals to subsequent rows up to said at least one spare row, and
   (d) using said defective row signal to switch the match line output of said row adjacent said defective row to the match line input of said defective row and switching said subsequent row match line output to said adjacent row match line input, repeating said switching for subsequent match lines up to said match line of said at least one spare row.

2. The method according to claim 1, wherein generating said signal indicative of the location of a defective row, includes programming a fuse bank with the location of the defective row.

3. The method according to claim 1, comprising programming a fuse bank in order to generate a fuse encoded signal and combining said fuse encoded signal with a normal address signal to generate said signal indicative of the location of said defective row.

4. The method according to claim 1, wherein generating said set of word line select signals comprises generating local word line select signals and global word line select signals and combining corresponding ones of said local word line select signals and said global word line select signals to generate said set of word line select signals.

5. A content addressable memory array, comprising:
   (a) a plurality of memory blocks; each block comprising:
      (i) a plurality of memory cells arranged in rows, said rows including a plurality of normal rows and at least one spare row, each row having a match line coupled to said memory cells in said row, said match line for providing a match line output signal indicative of a comparison result;
      (ii) a match line, decoder for selecting a plurality of match line signals to output, each aid match line signal to output being selected from one of two adjacent rows; and
      (iii) a sense amplifier coupled to said match line said sense amplifier for providing said comparison result at a sense amplifier output; and
   (b) a row select decoder for generating a plurality of word line select signals corresponding to said rows, each word line select signal selectively coupled to one of two adjacent rows.

6. The content addressable memory array according to claim 5, comprising a programmable bank for storing the location of at least one defective row, said programmable bank being coupled to said row select decoder in order to disable said at least one defective row.

7. The content addressable memory array according to claim 6, wherein said programmable bank is a programmable fuse bank.

8. The content addressable memory array according to claim 5, comprising a priority encoder having a plurality of match line inputs, said match line inputs coupled to said match line output signals selected by said match line decoder.

9. The content addressable memory array according to claim 8, wherein the number of match line inputs correspond to the number of normal rows in said content addressable memory array.

10. The content addressable memory array according to claim 8, further comprising a latch for latching said sense amplifier output.

11. The content addressable memory array according to claim 5, comprising for each row, a local word line and a global word line, said local word line and said global word line for generating a pair of signals that are combined to generate said word line select signal.

12. The content addressable memory array according to claim 5, wherein said at least one spare row is located at one end of the content addressable memory array.

* * * * *